United States Patent
Cai et al.

(10) Patent No.: US 10,663,143 B2
(45) Date of Patent: May 26, 2020

(54) MATERIALS AND OPTICAL COMPONENTS FOR COLOR FILTERING IN A LIGHTING APPARATUS

(71) Applicant: GE Lighting Solutions, LLC, East Cleveland, OH (US)

(72) Inventors: Dengke Cai, Mayfield Heights, OH (US); Thomas Clynne, East Cleveland, OH (US); Jianmin He, Orange, OH (US); Mark Edward Kaminski, Beachwood, OH (US); Benjamin Lee Yoder, Cleveland Heights, OH (US); Xiaojun Ren, ShangHai (CN); Huisheng Zhou, ShangHai (CN); Zhiyong Wang, ShangHai (CN); Jian Li, ShangHai (CN)

(73) Assignee: Consumer Lighting (U.S.), LLC, Norwalk, CT (US)

(*) Notice: Subject to any disclaimer, the term of this patent is extended or adjusted under 35 U.S.C. 154(b) by 139 days.

(21) Appl. No.: 15/515,755

(22) PCT Filed: Oct. 8, 2014

(86) PCT No.: PCT/CN2014/088116
§ 371 (c)(1),
(2) Date: Mar. 30, 2017

(87) PCT Pub. No.: WO2016/054764
PCT Pub. Date: Apr. 14, 2016

(65) Prior Publication Data
US 2017/0261181 A1    Sep. 14, 2017

(51) Int. Cl.
*F21V 9/08* (2018.01)
*F21V 3/04* (2018.01)
(Continued)

(52) U.S. Cl.
CPC .......... *F21V 9/08* (2013.01); *F21K 9/23* (2016.08); *F21K 9/66* (2016.08); *F21V 3/0625* (2018.02);
(Continued)

(58) Field of Classification Search
CPC ..... F21V 9/08; F21V 3/04; F21K 9/61; F21K 9/64
See application file for complete search history.

(56) References Cited

U.S. PATENT DOCUMENTS

| 2,188,298 A | 1/1940 | Hitchcock |
| 3,505,239 A | 4/1970 | Mazelsky et al. |

(Continued)

FOREIGN PATENT DOCUMENTS

| CN | 1360544 | 7/2002 |
| CN | 1503382 A | 6/2004 |

(Continued)

OTHER PUBLICATIONS

Stefanidaki et al., "Oxide Solubility and Raman Spectra of NdF3—LiF—KF—MgF2—Nd2O3 Melts", Journal of Chemical Society, Issue No. 11, pp. 2302-2307, 2002.

(Continued)

*Primary Examiner* — Karabi Guharay
(74) *Attorney, Agent, or Firm* — Wood IP LLC

(57) ABSTRACT

Materials and optical components formed thereof that are suitable for use in a lighting apparatus to impart a color filtering effect to visible light. At least a portion of such an optical component is formed of a composite material comprising a polymeric matrix material and an inorganic particulate material that contributes a color filtering effect to visible light passing through the composite material, and the particulate material comprises a neodymium compound containing $Nd^{3+}$ ions.

22 Claims, 3 Drawing Sheets

(51) Int. Cl.
  *G02B 1/04* (2006.01)
  *F21K 9/66* (2016.01)
  *F21K 9/23* (2016.01)
  *F21V 3/06* (2018.01)
  *G02B 5/22* (2006.01)
  *F21Y 115/10* (2016.01)
  *H01L 33/56* (2010.01)
  *F21K 9/232* (2016.01)
  *F21Y 113/13* (2016.01)

(52) U.S. Cl.
  CPC .............. *G02B 1/04* (2013.01); *G02B 5/223* (2013.01); *F21K 9/232* (2016.08); *F21Y 2113/13* (2016.08); *F21Y 2115/10* (2016.08); *H01L 33/56* (2013.01)

(56) References Cited

U.S. PATENT DOCUMENTS

| | | |
|---|---|---|
| 4,005,324 A | 1/1977 | Dolenga et al. |
| 4,395,653 A | 7/1983 | Graff |
| 4,441,046 A | 4/1984 | James |
| 4,633,127 A | 12/1986 | Beurskens et al. |
| 4,636,072 A | 1/1987 | Yahraus |
| 5,083,252 A | 1/1992 | McGuire |
| 5,252,887 A | 10/1993 | Reisman |
| 6,749,777 B2 | 6/2004 | Argoitia et al. |
| 6,761,959 B1 | 7/2004 | Bonkowski et al. |
| 7,583,443 B2 | 9/2009 | Zaczek |
| 7,695,641 B2 | 4/2010 | Mataki et al. |
| 8,349,225 B2 | 1/2013 | Yue |
| 8,389,958 B2 | 3/2013 | Vo-Dinh et al. |
| 8,415,410 B2 | 4/2013 | Nitta |
| 8,426,871 B2 | 4/2013 | Rapoport et al. |
| 8,459,814 B2 | 6/2013 | Su et al. |
| 8,704,261 B2 | 4/2014 | Komatsu et al. |
| 9,062,851 B2 | 6/2015 | Matsubayashi et al. |
| 9,312,249 B2 | 4/2016 | Choi et al. |
| 9,807,945 B2 | 11/2017 | Usami et al. |
| 9,837,584 B2 | 12/2017 | Yoo et al. |
| 10,168,030 B2 | 1/2019 | Trottier |
| 10,233,388 B2 | 3/2019 | Romer et al. |
| 2003/0031438 A1 | 2/2003 | Kambe et al. |
| 2004/0119086 A1 | 6/2004 | Yano et al. |
| 2004/0125459 A1 | 7/2004 | Tanitsu et al. |
| 2004/0196538 A1* | 10/2004 | Burgener, II .......... H01S 3/102 359/341.5 |
| 2004/0219116 A1 | 11/2004 | Reynders et al. |
| 2006/0176244 A1 | 8/2006 | Hori et al. |
| 2006/0255716 A1 | 11/2006 | Tsutsumi et al. |
| 2007/0241657 A1 | 10/2007 | Radkov et al. |
| 2009/0180788 A1 | 7/2009 | Tamoto et al. |
| 2009/0267033 A1 | 10/2009 | Zhang |
| 2009/0302236 A1 | 12/2009 | Vogt et al. |
| 2010/0149510 A1 | 6/2010 | Zaczek et al. |
| 2010/0277887 A1 | 11/2010 | Su et al. |
| 2011/0155972 A1 | 6/2011 | Wu |
| 2011/0250406 A1 | 10/2011 | Zia et al. |
| 2012/0057100 A1 | 3/2012 | Masuda et al. |
| 2012/0063151 A1 | 3/2012 | Juestel et al. |
| 2012/0155061 A1 | 6/2012 | Manabe et al. |
| 2012/0230032 A1 | 9/2012 | Sumiya et al. |
| 2013/0328100 A1 | 12/2013 | Kono et al. |
| 2014/0049965 A1 | 2/2014 | Aanegola et al. |
| 2014/0191653 A1 | 7/2014 | Edmond et al. |
| 2014/0226335 A1 | 8/2014 | Menkara |
| 2014/0257439 A1 | 9/2014 | Douglas |
| 2014/0268794 A1 | 9/2014 | Donofrio et al. |
| 2014/0268819 A1 | 9/2014 | Negley et al. |
| 2015/0070875 A1 | 3/2015 | Hirosaki et al. |
| 2015/0109758 A1 | 4/2015 | Allen et al. |
| 2015/0188006 A1 | 7/2015 | Williams et al. |
| 2015/0252953 A1 | 9/2015 | Progl et al. |
| 2015/0279651 A1 | 10/2015 | Reisman et al. |
| 2016/0097496 A1* | 4/2016 | Allen .............. F21V 3/12 257/40 |
| 2016/0097497 A1 | 4/2016 | Benner et al. |
| 2016/0099141 A1 | 4/2016 | Reisman et al. |
| 2016/0290573 A1* | 10/2016 | Allen .............. F21K 9/233 |
| 2016/0303394 A1 | 10/2016 | Hayashi et al. |

FOREIGN PATENT DOCUMENTS

| | | |
|---|---|---|
| CN | 1555308 A | 12/2004 |
| CN | 101522730 A | 9/2009 |
| CN | 102201549 A | 9/2011 |
| CN | 102401919 A | 4/2012 |
| CN | 102473821 A | 5/2012 |
| CN | 102782396 | 11/2012 |
| CN | 103026515 | 4/2013 |
| CN | 103043699 A | 4/2013 |
| CN | 104378970 | 2/2015 |
| CN | 105720163 A | 6/2016 |
| DE | 69917065 T2 | 4/2005 |
| EP | 1135973 A1 | 9/2001 |
| FR | 2978448 A1 | 2/2013 |
| JP | 5156851 A | 5/1976 |
| JP | 5158444 A | 5/1976 |
| JP | 58225148 A | 12/1983 |
| JP | H04-050136 A | 2/1992 |
| JP | 04194803 A | 7/1992 |
| JP | H04194803 | 7/1992 |
| JP | 2000-011954 A | 1/2000 |
| JP | 2000011954 A | 1/2000 |
| JP | 5156581 B2 | 3/2013 |
| JP | 5158444 B2 | 3/2013 |
| WO | 2008111878 A2 | 9/2008 |
| WO | 2011/142127 A1 | 11/2011 |
| WO | 2012119158 A1 | 9/2012 |
| WO | 2013/118206 A1 | 8/2013 |
| WO | 2013180216 A1 | 12/2013 |
| WO | 2014/063011 A1 | 4/2014 |
| WO | 2015035425 A1 | 3/2015 |
| WO | 2016/057604 A1 | 4/2016 |
| WO | 2016089810 A1 | 6/2016 |
| WO | 2016195938 A1 | 12/2016 |

OTHER PUBLICATIONS

Li et al., "Controllable Energy Transfer in Fluorescence Upconversion of NdF3 and NaNdF4 Nanocrystals", Optics Express, vol. No. 18, Issue No. 4, pp. 3364-3369, Feb. 15, 2010.

Reben et al., "Nd3+-doped oxyfluoride glass ceramics optical fibre with SrF2 Nanocrystals", Optica Applicata, vol. No. 42, Issue No. 2, pp. 353-364, 2012.

PCT Search Report and Written Opinion issued in connection with corresponding PCT Application No. PCT/CN2014/088116 dated Apr. 28, 2015.

PCT Search Report and Written Opinion issued in connection with related PCT Application No. PCT/US2015/054373 dated Dec. 21, 2015.

U.S. Non-Final Office Action issued in connection with related U.S. Appl. No. 14/966,329 dated Apr. 29, 2016.

U.S. Non-Final Office Action issued in connection with related U.S. Appl. No. 14/876,366 dated May 2, 2016.

U.S. Non-Final Office Action issued in connection with related U.S. Appl. No. 14/931,476 dated Jul. 18, 2016.

U.S. Final Office Action issued in connection with related U.S. Appl. No. 14/876,366 dated Feb. 8, 2017.

PCT Search Report and Written Opinion issued in connection with related PCT Application No. PCT/US2016/059974 dated Feb. 15, 2017.

PCT Search Report and Written Opinion issued in connection with related PCT Application No. PCT/US2016/065149 dated Feb. 27, 2017.

PCT Preliminary Report on Patentability issued in connection with related PCT Application No. PCT/US2015/054373 dated Apr. 20, 2017.

(56) References Cited

OTHER PUBLICATIONS

U.S. Final Office Action issued in connection with related U.S. Appl. No. 14/931,476 dated May 5, 2017.
Qing, Y., et al., Low Refractive Index Neodymium Fluoride Doped Polycarbonate, GE Application No. PCT/CN2017/075209, filed on Feb. 28, 2017.
Allen, G. R., et al., LED Encapsulation and LED Packages Employing Neodymium-Fluorine Materials, GE U.S. Appl. No. 62/061,129, filed Oct. 7, 2014.
Extended European Search Report and Opinion issued in connection with corresponding EP Application No. 14903619.6 dated May 17, 2018.
Notification of Reasons for Refusal issued in connection with corresponding JP Application No. 2017-518287 dated Oct. 9, 2018.
Beaury, et al., Neutron Powder Diffraction Studies of Stoichiometric NdOF Between 1.5 and 300 K, Solid State Sciences, vol. 4, (2002), pp. 1039-1043.

\* cited by examiner

MATERIALS AND OPTICAL COMPONENTS FOR COLOR FILTERING IN A LIGHTING APPARATUS

BACKGROUND OF THE INVENTION

The present invention generally relates to lighting systems and related technologies. More particularly, this invention relates to materials and methods suitable for imparting a color filtering effect to light sources, nonlimiting examples of which include lighting apparatus that utilize one or more light-emitting diodes (LEDs) as a light source.

LED lamps provide a variety of advantages over more traditional incandescent and fluorescent lamps, including but not limited to a longer life expectancy, high energy efficiency, and full brightness without requiring time to warm up. As known in the art, LEDs (which as used herein also encompasses organic LEDs, or OLEDs) are solid-state semiconductor devices that convert electrical energy into electromagnetic radiation that includes visible light (wavelengths of about 400 to 750 nm). An LED typically comprises a chip (die) of a semiconducting material doped with impurities to create a p-n junction. The LED chip is electrically connected to an anode and cathode, all of which are often mounted within a package. Because, in comparison to other lamps such as incandescent or fluorescent lamps, LEDs emit visible light that is more directional in a narrower beam, LEDs have traditionally been utilized in applications such as automotive, display, safety/emergency, and directed area lighting. However, advances in LED technology have enabled high-efficiency LED-based lighting systems to find wider use in lighting applications that have traditionally employed other types of lighting sources, including omnidirectional lighting applications previously served by incandescent and fluorescent lamps. As a result, LEDs are increasingly being used for area lighting applications in residential, commercial and municipal settings.

FIG. 1 represents a nonlimiting commercial example of an LED-based lighting unit suitable for area lighting applications. The lighting unit (which may also be referred to as a "lighting apparatus" or "lamp") 10 is represented as an LED lamp (ANSI A19 type) configured to provide a nearly omnidirectional lighting capability. LED-based lighting units of various other configurations are also known. As represented in FIG. 1, the lamp 10 comprises a transparent or translucent cover or enclosure 12, an Edison-type threaded base connector 14, a housing or base 16 between the enclosure 12 and the connector 14, and, optionally, heat-dissipating fins 18 that enhance radiative and convective heat transfer to the surrounding environment.

An LED-based light source, often an LED array comprising multiple LED devices, is typically located at the lower end of the enclosure 12 adjacent the base 16. Because LED devices emit visible light in narrow bands of wavelengths, for example, green, blue, red, etc., combinations of different LED devices are often combined in LED lamps to produce various light colors, including white light. Alternatively, light that appears substantially white may be generated by a combination of light from a blue LED and a phosphor (e.g., YAG:Ce) that converts at least some of the blue light of the blue LED to a different color; the combination of the converted light and the blue light can generate light that appears white or substantially white. The LED devices may be mounted on a carrier mounted to or within the base 16, and may be encapsulated on the carrier, for example, with a protective cover, often formed of an index-matching material to enhance the efficiency of visible light extraction from the LED devices. As a nonlimiting example, FIG. 2 represents a portion of an LED device 20 of a type that comprises a dome 22 that serves as an optically transparent or translucent envelope enclosing an LED chip 24 mounted on a printed circuit board (PCB) 26. A phosphor may also be used to emit light of color other than what is generated by an LED. For this purpose, the inner surface of the dome 22 may be provided with a coating 28 that contains a phosphor composition, in which case electromagnetic radiation (for example, blue visible light, ultraviolet (UV) radiation, or near-visible ultraviolet (NUV) radiation) emitted by the LED chip 24 can be absorbed by the phosphor composition, resulting in excitation of the phosphor composition to produce visible light that is emitted through the dome 22. As an alternative, the LED chip 24 may be encapsulated on the PCB 26 with a coating, and such a coating may optionally contain a phosphor composition for embodiments in which LED-phosphor integration with LED epitaxial (epi) wafer or die fabrication is desired.

To promote the capability of the lamp 10 to emit visible light in a nearly omnidirectional manner, the enclosure 12 is represented in FIG. 1 as substantially spheroidal or ellipsoidal in shape. Other means of promoting light distribution (e.g., omnidirectional light distribution) are possible. To further promote a near omnidirectional lighting capability, the enclosure 12 may be formed of a material that enables the enclosure 12 to function as an optical diffuser. As a nonlimiting example, the enclosure 12 may be or may include an assembly comprising a pair of semispherical diffusers between which an internal reflector (not shown) may be disposed, such that visible light generated by the LED devices is directed into the interior of the enclosure 12, a portion of the generated light is reflected by the reflector into the semispherical diffuser nearer the base 16, through which the reflected light is distributed to the environment surrounding the lamp 10. The remainder of the generated light passes through an opening in the reflector and enters the second semispherical diffuser, through which the passed light is distributed to the environment surrounding the lamp 10. Materials commonly employed to produce the diffuser may include polyamides (e.g., nylon), polycarbonate (PC), or polypropylene (PP); or the like. These polymeric materials typically may contain a filler, for example, titania ($TiO_2$), to promote refraction of the light and thereby achieve a white reflective appearance. The inner surface of the enclosure 12 may be provided with a coating (not shown), for example, a coating that contains a phosphor composition.

Though the use of combinations of different LED devices and/or phosphors can be utilized to promote the ability of LED lamps to produce a white light effect, other approaches are desirable as alternatives or in addition thereto.

BRIEF DESCRIPTION

The present invention provides materials and optical components formed thereof that are suitable for use in a lighting apparatus to impart a color filtering effect to visible light.

According to one aspect of the invention, at least a portion of an optical component is formed of a composite material comprising a polymeric matrix material and an inorganic particulate material that contributes a color filtering effect to visible light passing through the composite material, and the particulate material comprises a neodymium compound containing $Nd^{3+}$ ions.

Other aspects of the invention encompass a lighting apparatus that include a light source that emits visible light and an optical component that is configured and arranged so that at least a portion of the visible light of the light source passes therethrough. The portion of the optical component is formed of a composite material comprising a polymeric matrix material and an inorganic particulate material that contributes a color filtering effect to the visible light passing through the portion, and the particulate material comprises a neodymium compound containing $Nd^{3+}$ ions.

Additional aspects of the invention include utilization of a composite material of a type described above, wherein the neodymium compound can be present as discrete particles (or as a dopant in the particulate material) to promote refractive index matching of the particulate material and the polymeric matrix material sufficient to impart a low-haze optical effect to visible light emitted by the lighting apparatus. Without being limited by theory, such low-haze optical effect is believed to be due at least in part to minimizing Mie scattering. Alternatively, the neodymium compound can be present as discrete particles optionally combined with second particles of the particulate material to promote refractive index mismatching of the particulate material and polymeric matrix material sufficient to impart a diffusive optical effect to visible light emitted by the lighting unit.

Technical effects of the composite materials, optical components, and lighting units described above preferably include the capability of providing a desirable color filtering effect, and preferably with the further capability of intentionally matching or mismatching the refractive index of the matrix material to minimize or promote, respectively, optical scattering of light passing through the composite materials and optical components.

Other aspects and advantages of this invention will be better appreciated from the following detailed description.

DETAILED DESCRIPTION

Figure 1:
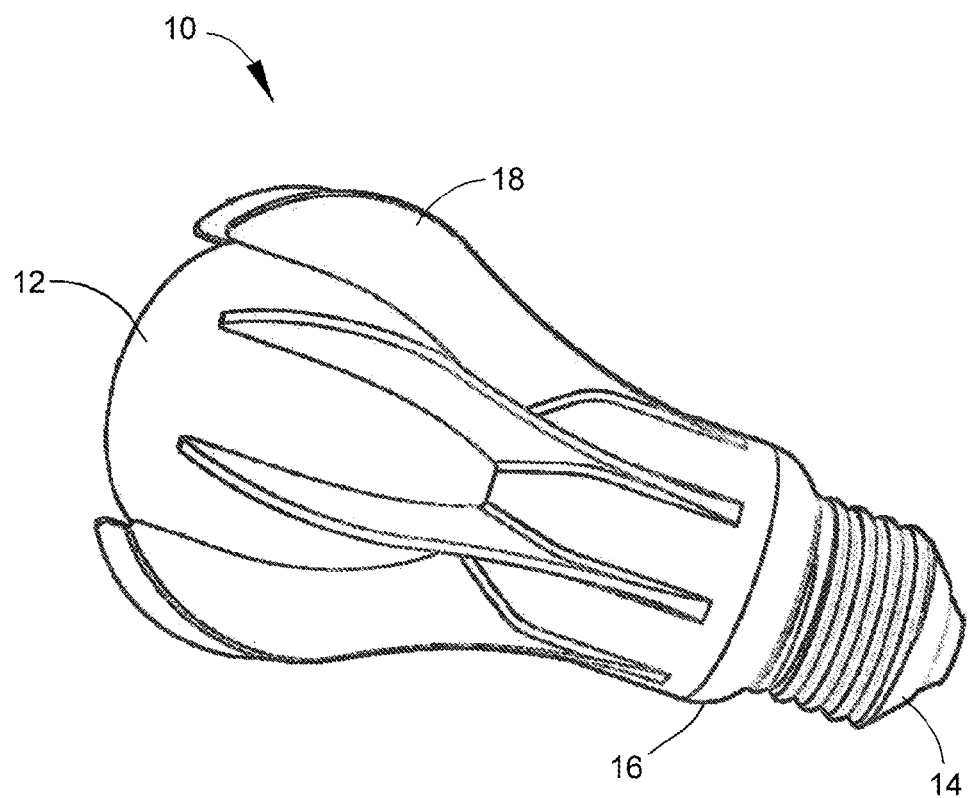
FIG. 1 represents an LED-based lighting apparatus of a type capable of benefitting from the inclusion of an optical component containing a neodymiumcomposition in accordance with a nonlimiting embodiment of this invention.
Figure 2:
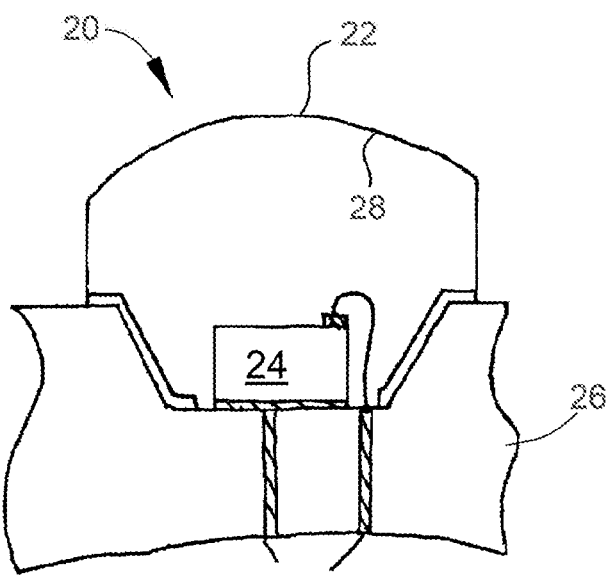
FIG. 2 represents a fragmentary cross-sectional view of an LED device of a type capable of use in an LED-based lighting apparatus, for example, of the type represented in FIG. 1.

The following discussion will make reference to the LED-based lighting apparatus 10 represented in FIG. 1 and the LED device 20 represented in FIG. 2. However, it should be appreciated that lighting units and LED devices of various other configurations are also within the scope of the invention.

The present invention provides composite materials and optical components formed thereof that are suitable for use in lighting apparatuses to impart a color filtering effect to visible light, a particular example being visible light generated by an LED device. As used herein, an optical component is a component having at least a portion through which visible light is desired to pass through to provide a lighting effect. The composite materials and optical components contain a source of $Nd^{3+}$ ions. Through investigations leading to the present invention, such a source has been determined to be effective for providing a color filtering effect, in particular to filter visible light in the yellow light wavelength range, for example, wavelengths of about 560 nm (nanometer) to about 600 nm.

According to certain aspects of the invention, such composite materials and optical components may have little if any optical scattering (diffusion) effect; or, alternatively, may cause considerable optical scattering on light passing therethrough, depending on the composition of the composite material and the composition and amount of the $Nd^{3+}$ ion source in the composite material. The desired effect can be selected based on these factors. As examples, preferred composite materials comprise a polymeric matrix material in which is dispersed an inorganic particulate material containing the source of $Nd^{3+}$ ions. The $Nd^{3+}$ ion source may be a neodymium compound present as a dopant in the particulate material, or present as discrete particles of a neodymium compound that may be optionally combined with particles of other materials to make up the particulate material. A particulate material containing discrete particles of a neodymium compound (e.g., formed partially or entirely of the neodymium compound) and/or particles of another material doped with the neodymium compound, can be combined with a polymeric matrix material for the purpose of promoting refractive index matching of the particulate and polymeric matrix materials (i.e., minimize the difference in their refractive indices) sufficient to impart a low-haze (low-diffusivity) optical effect to visible light passing through the composite material. Alternatively, a particulate material can be solely made up of discrete particles of the neodymium compound (e.g., formed partially or entirely of the neodymium compound) and/or made up of a mixture of discrete particles of the neodymium compound (e.g., formed partially or entirely of the neodymium compound) and particles formed of at least one other different material, so that the particulate material has a refractive index that is sufficiently different from that of the polymeric matrix material to achieve a refractive index mismatch between the particulate and polymeric matrix materials (i.e., increase the difference in their refractive indices) to impart a diffusive optical effect to visible light passing through the composite material.

In view of this ability to tailor the optical scattering effect of the composite material, optical components formed of the composite materials may have diverse functions. For example, one such function may be to provide a color filtering effect, such as if used to form a dome of an LED device (such as in, for example, FIG. 2). Another exemplary function may be to additionally provide (i.e., in addition to a color filtering effect) an optical scattering effect, such as if used to form the enclosure/diffuser 12 of the lighting apparatus 10 of FIG. 1.

One source for the $Nd^{3+}$ ions may be materials comprising a Nd—F compound. As used herein, an "Nd—F compound" should be broadly construed to include compounds comprising neodymium and fluoride and optionally other elements. Such compounds comprising neodymium and fluoride may comprise neodymium fluoride, or neodymium oxyfluoride (e.g., $NdO_xF_y$, where 2x+y=3), or neodymium fluoride comprising adventitous water and/or oxygen, or a neodymium hydroxide fluoride (e.g., $Nd(OH)_aF_b$ where a+b=3), or numerous other compounds comprising neodymium and fluoride which will be become readily apparent from the following description. In some applications, the Nd—F compound may have a relatively low refractive index, such as a refractive index that matches selected polymeric materials to provide a low-haze optical component. One useful $Nd^{3+}$ ion source is believed to be neodymium fluoride ($NdF_3$), which has a refractive index of around 1.6, providing a suitably low refractive index for index matching with certain polymeric matrix materials to minimize scattering losses. Other $Nd^{3+}$ ion sources are possible, for example, other compounds containing Nd—F, nonlimiting examples of which include Nd—X—F compounds where X is at least one element that forms a compound with neodymium, as examples, oxygen, nitrogen, sulfur, chlorine, etc., or at least one metallic element (other than Nd) that forms a compound with fluorine, as examples, metallic elements such as Na, K, Al, Mg, Li, Ca, Sr, Ba, and Y, or combinations of such elements. Particular examples of Nd—X—F compounds may include: neodymium oxyfluoride (Nd—O—F) compounds; Nd—X—F compounds in which X may be Mg and Ca or may be Mg, Ca and O; as well as other compounds containing Nd—F, including perovskite structures doped with neodymium. Certain Nd—X—F compounds may advantageously enable broader absorption at wavelengths of about 580 nm. Since a neodymium oxyfluoride compound may comprise varying amounts of O and F (since neodymium oxyfluoride compounds are typically derived from varying amounts of neodymia and $NdF_3$), a neodymium oxyfluoride compound may have a selected refractive index that is between that of a Nd—O compound (for example, 1.8 for neodymia) and a Nd—F compound (for example, 1.60 for $NdF_3$). Nonlimiting examples of perovskite structure materials doped with neodymium include those containing at least one constituent having a lower refractive index than the neodymium compound (e.g., $NdF_3$), for example, metal fluorides of Na, K, Al, Mg, Li, Ca, Sr, Ba, and Y. Such "host" compounds have lower refractive indices than $NdF_3$ in the visible light region, nonlimiting examples of which include NaF (n=1.32), KF (n=1.36), $AlF_3$ (n=1.36), $MgF_2$ (n=1.38), LiF (n=1.39), $CaF_2$ (n=1.44), $SrF_2$ (n=1.44), $BaF_2$ (n=1.48), and $YF_3$ (n=1.50) at a wavelength of 589 nm. As a result of doping with a high refractive index Nd—F compound, for example, $NdF_3$, the resulting doped perovskite structure compound has a refractive index that is between that of the host (for example, 1.38 for $MgF_2$) and $NdF_3$ (1.60). The refractive index of the $NdF_3$-doped metal fluoride compound will depend on the ratio of Nd ions and metal ions.

Generally, a low-haze (low-diffusivity) optical effect, typically due to a minimal level of optical scattering, is said to be achieved herein if the refractive indices of the matrix and particulate materials are within 0.1 of each other in the visible light region. If $NdF_3$ is used as the sole inorganic particulate material in an optical component whose polymeric matrix material is a polycarbonate (PC) or polystyrene (PS), the refractive indices of $NdF_3$ (about 1.60) and PC and PS (about 1.586) are such that a minimal level of optical scattering occurs when light passes through the component. Another example of a polymer having a refractive index within 0.1 of $NdF_3$ is a fluorine-doped polyester (refractive index of about 1.607). In this regard, the polymeric matrix material is chosen on the basis of having a refractive index that is similar to the neodymium compound so as to achieve a low-haze (low-diffusivity) optical effect.

Refractive index matching with other polymers having refractive indices that differ from the neodymium compound in the visible light region by more than 0.1 can be achieved with modifications to the particulate material. For example, the source of $Nd^{3+}$ ions (e.g., $NdF_3$) can be used in combination with one or more other materials, to yield an effective refractive index that achieves a minimal level of optical scattering in an optical component whose polymeric matrix material has a refractive index that differs from the $Nd^{3+}$ ion source by more than 0.1 in the visible light region, for example, acrylics (for example, polymethyl methacrylate; PMMA), polyalkylidene fluorides (e.g., polyvinylidene fluoride (PVDF)), silicone, etc. As a nonlimiting example, particles formed of a metal fluoride and/or a metal oxide can be doped with the neodymium compound to have a refractive index between that of the neodymium compound and the metal fluoride and/or metal oxide. Nonlimiting examples of suitable metal fluorides and metal oxides include NaF (refractive index of about 1.32) and $MgF_2$ (refractive index of about 1.38). By selecting an appropriate ratio of the neodymium compound and the metal fluoride and/or metal oxide, the refractive index of the particulate material can be tailored to allow for matching or near matching with the refractive index of PMMA (about 1.49), polyvinylidene fluoride (about 1.42), or a methyl-type silicone (about 1.41), which are often utilized in LED packages.

Figure 3:
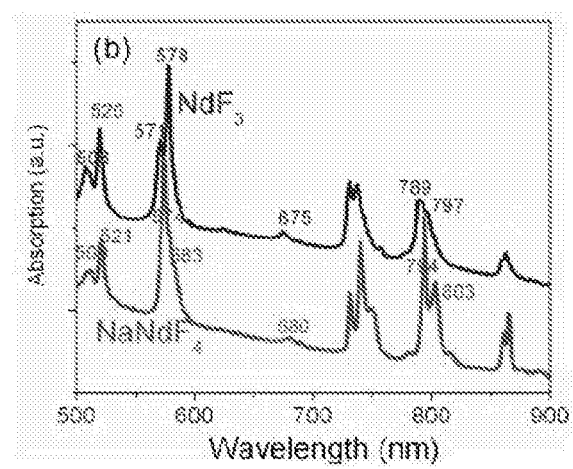
FIG. 3 is a graph representing the absorption spectra observed for $NdF_3$ and $NaNdF_4$ nanocrystals.
Figure 4:
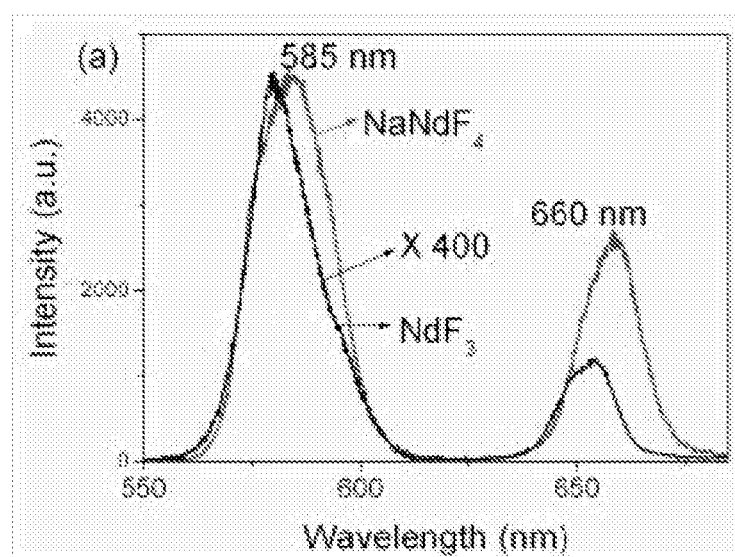
FIG. 4 is a graph representing the upconversion fluorescence spectra for $NdF_3$ and $NaNdF_4$ nanocrystals when subjected to an excitation frequency ($\lambda_{exc}$) of 800 nm and an excitation power of 240 mW.

FIGS. 3 and 4 are graphs adapted from the following publication: "Controllable Energy Transfer in Fluorescence Upconversion of $NdF_3$ and $NaNdF_4$ Nanocrystals", Li et al., Optics Express, Vol. 18 Issue 4, pp. 3364-3369 (2010). The graphs may represent optical properties for $NdF_3$ and $NaNdF_4$ nanocrystals dispersed in water at the same molar concentration. FIG. 3 represents the absorption spectra observed for the $NdF_3$ and $NaNdF_4$ nanocrystals, and FIG. 4 represents the upconversion fluorescence spectra for the $NdF_3$ and $NaNdF_4$ nanocrystals when subjected to an excitation frequency ($\lambda_{exc}$) of 800 nm and an excitation power of 240 mW. As evident from FIG. 3, the absorption peaks of $NdF_3$ and $NaNdF_4$ were 578 and 583, respectively, and therefore well within the yellow light wavelength range (about 560 to about 600 nm). FIG. 4 evidences that the absorption peaks of $NaNdF_4$ were slightly shifted relative to those of $NdF_3$. FIGS. 3 and 4 indicate that combination of $NdF_3$ and NaF (to yield $NaNdF_4$) did not fundamentally change the absorption characteristics of $NdF_3$. As such, it is believed that a desirable color filtering effect can be achieved with composite materials containing particles containing a compound other than Nd—F that has been doped with an Nd—F compound to yield an Nd-M-F compound (where M is a metal other than neodymium).

A diffusive optical effect, typically due to optical scattering, may be achieved herein if the difference in the refractive indices of the polymeric matrix and particulate materials exceeds 0.1 in the visible light region. As one example, $NdF_3$ (or another $Nd^{3+}$ ion source) can be used as the sole inorganic particulate material in an optical component whose polymeric matrix material has a refractive index that is sufficiently different from $NdF_3$, for example, PMMA, PVDF, or a silicone. As another example, a particulate material formed of perovskite structure materials containing a metal oxide and an $Nd^{3+}$ ion source can be used. Such perovskite structure materials include those containing oxides of at least two of Ca, Ba, Al, Y, V, Gd, and Sr, which can exhibit refractive indices of greater than 1.7, such that a desirable color filtering effect and optical scattering can be achieved with these materials when used in combination with polymeric matrix materials such as PC, PS, PMMA, PVDF, or silicone.

Increased refractive index mismatch can also be achieved by combining particles of $NdF_3$ (or another $Nd^{3+}$ ion source) with particles of other materials, notable examples of which include metal oxides such as rutile titania ($TiO_2$; refractive index of about 2.74) and Nd—O compounds (such as $Nd_2O_3$) or other neodymium-containing metal oxides (such as Nd-containing perovskite structure materials). With this approach, the particles of $NdF_3$ (or another $Nd^{3+}$ ion source) may be largely or solely responsible for the color filtering effect and the second particles may be largely or solely responsible for achieving a significant level of optical scattering.

Figure 5:
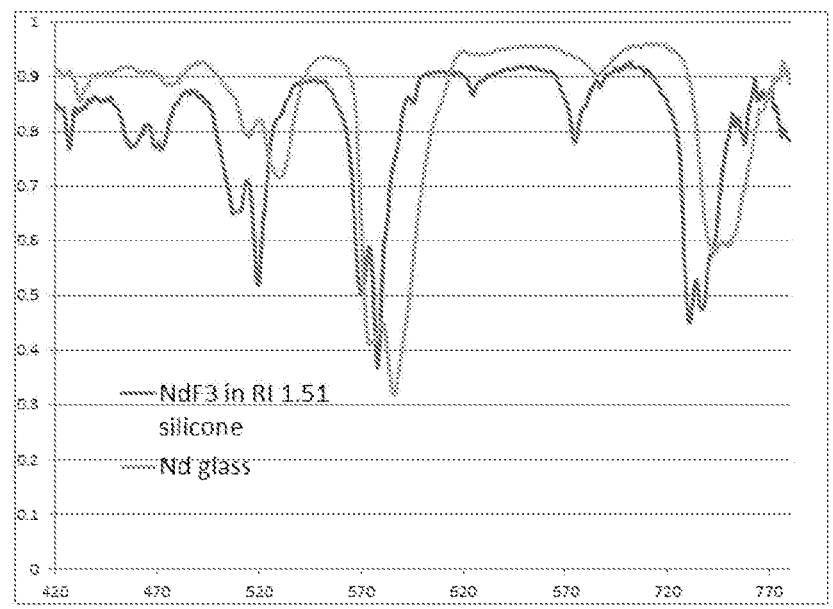
FIG. 5 is a graph representing optical transmission characteristics of $NdF_3$ dispersed in a silicone matrix, in comparison to that of an $Nd_2O_3$-doped glass.

The color filtering effect resulting from visible light absorption provided by $Nd^{3+}$ ions in the visible light spectrum is believed to be superior to Nd—O compounds (such as $Nd_2O_3$) with respect to yellow light wavelengths within the range of about 560 nm to about 600 nm. Nd—F and Nd—X—F compounds have a further advantage over Nd—O compounds by having a refractive index much closer to various standard optical grade transparent plastics, for example, PC, PS, PMMA, PVDF, silicone, and polyethylene terephthalate (PET), and can better balance optical losses from scattering attributable to refractive index mismatch and Nd ion absorption. By filtering yellow light wavelengths through the use of Nd—F and/or Nd—X—F compounds, light emitted by one or more white LED devices can be adjusted to achieve an enhanced color rendering effect. For example, an enhanced color rendering effect may be an enhanced red-green color contrast; or, an enhanced color rendering effect may be an increased LED white light CRI (color rendering index) or CSI (color saturation index), or may enable color points closer to the white locus (the "white body line"). By filtering yellow light wavelengths through the use of Nd—F and/or Nd—X—F compounds, light emitted by one or more white LED devices can be adjusted to achieve a lighting effect similar to that of the REVEAL line of incandescent bulbs (commercially available from GE Lighting). The REVEAL line of incandescent bulbs are produced to have an outer jacket formed of a glass doped with neodymia ($Nd_2O_3$) to filter certain wavelengths of light. FIG. 5 is a graph representing the optical transmission of $NdF_3$ dispersed in a silicone matrix in comparison to that of an $Nd_2O_3$-doped glass, and evidences the similarities in their optical transmissions, particularly in terms of their abilities to filter yellow light wavelengths.

The volumetric amount and particle size of the particulate source of $Nd^{3+}$ ions in a composite material is believed to have an influence on the color filtering effect of the composite material. In addition, the relative amounts and particle size of any second material in the composite material has an influence on the color filtering effect. Generally, it is believed that a composite material formed of a standard optical grade transparent plastic (for example, PC, PS, PMMA, PVDF, silicone, or PET) should contain at least 0.1 volume percent and more preferably about 1 to about 20 volume percent of $NdF_3$ or another $Nd^{3+}$ ion source (as examples, Nd—F compounds and Nd—X—F compounds, e.g., $MgF_2$ doped with Nd—F) to achieve a desired filtering effect. If present, any second material (e.g., $TiO_2$, Nd-containing compounds, and Nd-containing perovskite structure materials having a high refractive index relative to $NdF_3$, etc.) may be present in an amount of up to 20 volume percent, more preferably about 0.01 to about 2 volume percent, depending on the scattering profile desired for an optical diffuser. A preferred total particulate loading in the composite material is believed to be at least 0.01 up to about 20 volume percent, more preferably about 0.01 to about 2 volume percent. It is further believed that a suitable particle size for the particulate material is up to about 50 micrometers and preferably about 0.5 to about 5 micrometers. At these loadings and particles sizes, a composite material whose matrix material is one of the aforementioned standard optical grade transparent plastics will typically be readily moldable for a wide variety of shapes, with potential difficulties being encountered with smaller particle sizes and higher loadings.

While the invention has been described in terms of certain embodiments, it is apparent that other forms could be adopted by one skilled in the art. Therefore, the scope of the invention is to be limited only by the following claims.

The invention claimed is:

1. An optical component of a lighting apparatus, at least a portion of the optical component being formed of a composite material comprising a polymeric matrix material and a particulate material that contributes a color filtering effect to visible light passing through the composite material;

wherein, the particulate material has a particle size of up to 50 micrometers and comprises a neodymium compound containing $Nd^{3+}$ ions, the neodymium compound being a Nd—X—F compound;

and wherein X is at least one element that forms a compound with neodymium.

2. The optical component according to claim 1, wherein the particulate material predominantly filters wavelengths in a yellow light wavelength range.

3. The optical component according to claim 1, wherein the neodymium compound is present as discrete particles of the particulate material.

4. The optical component according to claim 1, wherein the particulate material is an inorganic particulate material, and wherein the neodymium compound is present as a dopant in particles of the inorganic particulate material.

5. The optical component according to claim 1, wherein the neodymium compound is Nd—O—F.

6. The optical component according to claim 1, wherein X is at least one metallic element other than neodymium that forms a compound with fluorine.

7. The optical component according to claim 1, wherein X is at least one element chosen from the group consisting of: elements that form compounds with neodymium; and metallic elements other than neodymium that form compounds with fluorine.

8. The optical component according to claim 1, wherein the neodymium compound is present in the composite material in an amount of at least about 0.1 volume percent.

9. The optical component according to claim 1, wherein the neodymium compound is present in the composite material in an amount of about 1 to about 20 volume percent.

10. The optical component according to claim 1, wherein the neodymium compound and the polymeric matrix material have refractive indices within 0.1 of each other in the visible light region.

11. The optical component according to claim 1, wherein the particulate material and the polymeric matrix material have refractive indices within 0.1 of each other in the visible light region.

12. The optical component according to claim 11, wherein the neodymium compound is present as a dopant in particles of the particulate material, and the particles are formed of a second material other than the neodymium compound.

13. The optical component according to claim 12, wherein a source of the $Nd^{3+}$ ions is $NdF_3$.

14. The optical component according to claim 12, wherein the particles are formed of at least one material selected from metal fluorides or metal oxides having refractive indices less than the polymeric matrix material.

15. The optical component according to claim 12, wherein the particles are formed of at least one material chosen from the group consisting of NaF, $MgF_2$, KF, $AlF_3$, LiF, $CaF_2$, $SrF_2$, $BaF_2$, and $YF_3$.

16. The optical component according to claim 11, wherein the optical component is an enclosure or dome enclosing an LED device of the lighting apparatus.

17. The optical component according to claim 1, wherein the particulate material and the polymeric matrix material have refractive indices that differ by more than 0.1 in the visible light region.

18. The optical component according to claim 17, wherein the neodymium compound is present as discrete particles of the particulate material.

19. The optical component according to claim 18, wherein the particulate material further comprises particles of a second material other than a neodymium compound.

20. The optical component according to claim 19, wherein the second material has a higher refractive index than the neodymium compound.

21. The optical component according to claim 20, wherein the second material is chosen from the group consisting of titania, neodymium-containing compounds, and neodymium oxide compounds.

22. A lighting apparatus comprising a light source that emits visible light and an optical component configured and arranged so that at least some of the visible light of the light source passes therethrough, a portion of the optical component being formed of a composite material comprising a polymeric matrix material and an inorganic particulate material having a particle size of up to 50 micrometers, the composite material and the inorganic particulate material both contributing a color filtering effect to the visible light passing through the portion;

wherein, the inorganic particulate material comprises a Nd—X—F compound;

and wherein X is at least one element that forms a compound with neodymium.

* * * * *